United States Patent [19]

Hsu et al.

[11] Patent Number: 5,414,351
[45] Date of Patent: May 9, 1995

[54] METHOD AND APPARATUS FOR TESTING THE RELIABILITY OF SEMICONDUCTOR TERMINALS

[75] Inventors: Chen-Chung Hsu; Chin-Ku Lo, both of Hsin-Chu, Taiwan, Prov. of China

[73] Assignee: United Microelectronics Corporation, Hsinchu, Taiwan, Prov. of China

[21] Appl. No.: 139,859

[22] Filed: Oct. 22, 1993

[51] Int. Cl.6 ............................................. G01R 1/04
[52] U.S. Cl. .................................. 324/756; 324/158.1
[58] Field of Search ................... 324/525, 691, 158 F, 324/158 R, 756–763, 158.1; 73/588, 12

[56] References Cited

U.S. PATENT DOCUMENTS 4,004,449 1/1977 Gorey et al. ............................. 73/12
4,465,973 8/1984 Countryman, Jr. ............ 324/158 R

OTHER PUBLICATIONS

"Wafer Level Joule–Heated J–Constant BM Tests", 1992 WRL Final Report, pp. 176–197.
"Characteristics of a Surface Conductivity Moisture Monitor for Hermetic Integrated Circuit Packages", in CH 1425 8/179/0000-0097, C 1979 IEEE pp. 97–100.

Primary Examiner—Kenneth A. Wieder
Assistant Examiner—Barry C. Bowser
Attorney, Agent, or Firm—George O. Saile

[57] ABSTRACT

A method is described for testing the reliability of terminals in a semiconductor package proposes the placing of a test chip in the package, wherein the test chip has an insulating substrate, a conductive metal blanket layer on the substrate, a passivating layer over the metal layer provided with a plurality of openings, a plurality of Gold (Au) terminals in the openings bonded to the metal layer, and a master ground terminal bonded to the metal layer. Input/Output (I/O) terminals are provided in the package structure for each of the Au terminals, and master terminals are connected to the I/O terminals with wire, the test chip is sealed in the package. The resistance of each of the terminals is then monitored over a period of time to determine any change of electrical resistance, which is indicative of terminal deterioration. The package can be subjected to various stresses during the monitoring, to obtain a correlation between terminal deterioration under mechanical or electrical stress over a time interval.

17 Claims, 4 Drawing Sheets

METHOD AND APPARATUS FOR TESTING THE RELIABILITY OF SEMICONDUCTOR TERMINALS

BACKGROUND OF THE INVENTION

1. Field of the Invention

The present invention relates to the testing of terminals, and more particularly to a method and an apparatus to monitor, over a period of time, the integrity of terminals inside a semiconductor package assembly.

2. Description of the Prior Art

The reliability of semiconductor products have been tested by operating the semiconductor products in various environments over prolonged periods of time, until they fail and then, inspecting the device to determine the cause of failure. In order to reduce the time to failure, it is common practice to operate the devices being tested under stress, i.e. at elevated temperatures that are well above the normal operating temperatures, under adverse environmental conditions, such as corrosive environments, thermal cycling, etc. These measures are calculated to increase the stress and thereby cause failure at some proportional length of time, relative to operation at normal conditions. Failure of Aluminum (Al) stripes on semiconductor devices due to electromigration has been extensively studied by increasing the current density in the stripe, and the temperature of operation, to produce failure in greatly reduced times than could be obtained by normal operation. This type of testing is described by Hisao Katto in an article entitle, "Wafer Level Joule-heated J-Constant EM Tests", in 1992 WRL Final Report, Pages 176–197.

An article describing the monitoring of moisture in a hermetic package by Lowry et al, entitled, "Characteristics Of A Surface Conductivity Moisture Monitor For Hermetic Integrated Circuit Packages", appears in CH 1425 8//79/0000-0097 $ 00.75 c 1979 IEEE, Pages 97–100. Another article by J. S. Sweet, entitled "The Use Of Special Purpose Assembly Test Chips for Evaluating Reliability In Packaged Devices", published by Sandia National Labs, Pages 15–19. It describes a series of special purpose assembly test chips to aid in reliability assessment of packaged integrated circuits. These chips contain special purpose circuits or sensors which either enhance the detection of failures, or the detection of moisture, or containments, which can lead to device failure.

SUMMARY OF THE INVENTION

It is therefore an object of the invention to provide a new method for testing the reliability of terminals in a sealed semiconductor package.

Another object of the present invention is to provide a new apparatus for testing the reliability of terminals in a semiconductor package.

The method of the invention for testing the reliability of terminals in a semiconductor package proposes the placing of a test chip in the package, wherein the test chip has an insulating substrate, a conductive metal blanket layer on the substrate, a passivating layer over the metal layer provided with a plurality of openings, a plurality of Gold (Au) terminals in the openings bonded to the metal layer, and a master ground terminal bonded to the metal layer. Input/Output (I/O) terminals are provided in the package structure for each of the Au terminals, and master terminals are connected to the I/O terminals with wire, the test chip is sealed in the package. The resistance of each of the terminals is then monitored over a period of time to determine any change of electrical resistance, which is indicative of terminal deterioration. The package can be subjected to various stresses during the monitoring, to obtain a correlation between terminal deterioration under mechanical or electrical stress over a time interval.

The apparatus of the invention includes the test chip, which was previously described, in combination with a sealed package.

BRIEF DESCRIPTION OF THE DRAWINGS

The above objects, features and advantages of the present invention will become more apparent from the following detailed description, taken in conjunction with the drawings wherein.

DETAILED DESCRIPTION OF THE INVENTION

Figure 1:
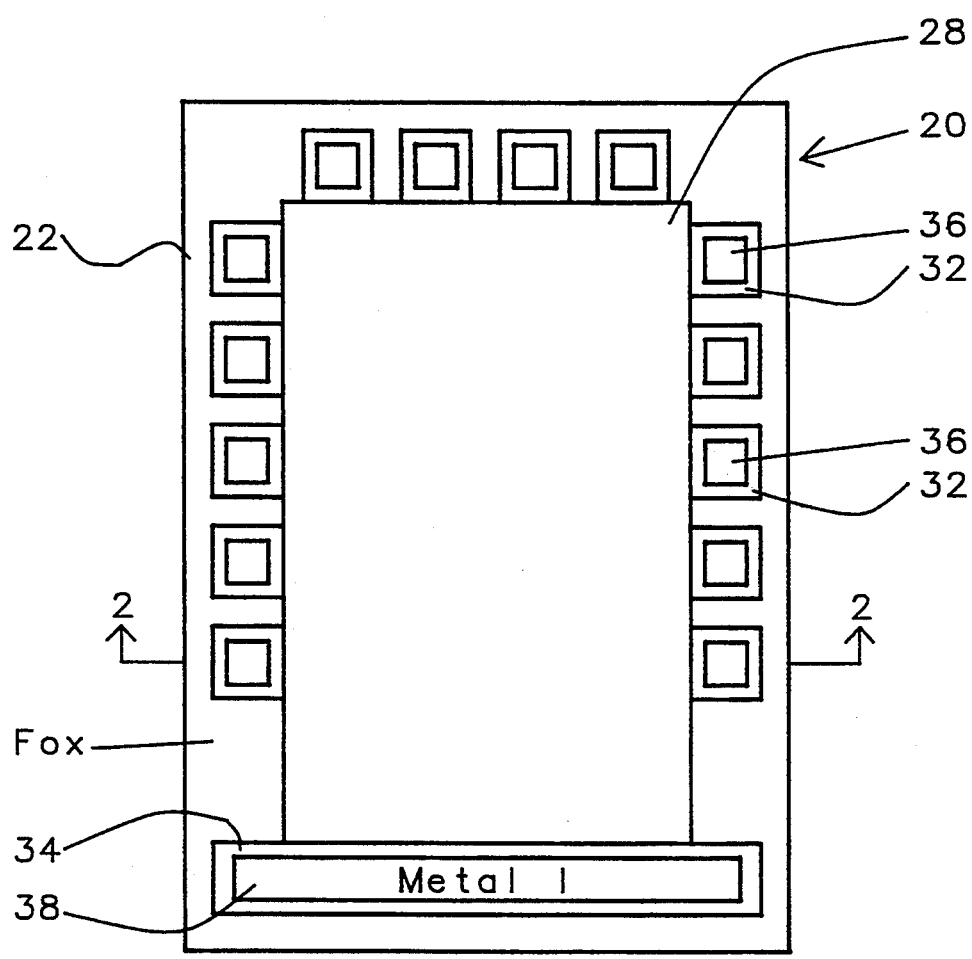
FIG. 1 is a top plan view, in greatly enlarged scale, of a preferred embodiment of the test chip of the invention.
Figure 2:
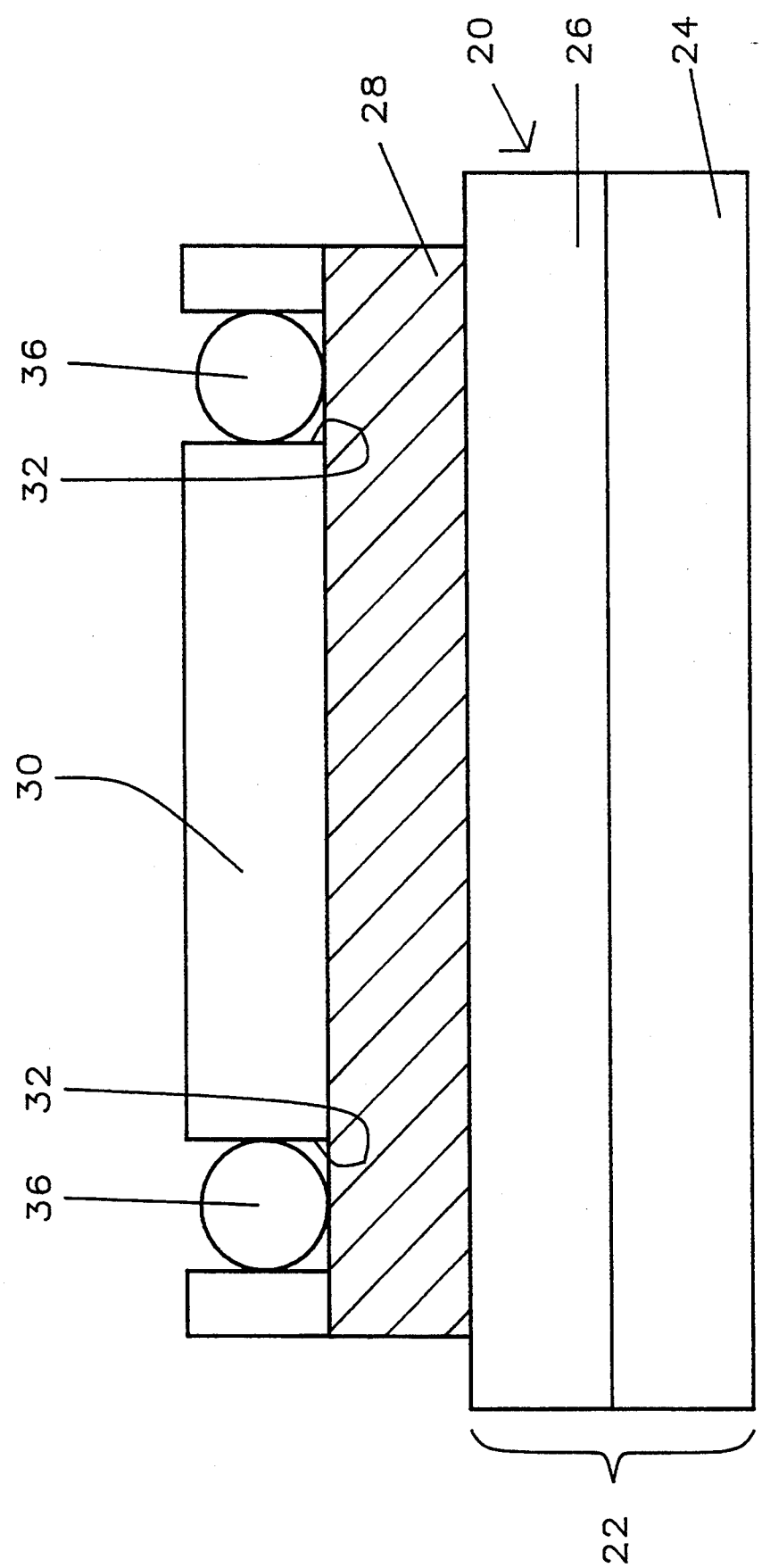
FIG. 2 is a cross sectional view taken on line 2—2' of FIG. 1.

Referring now to the drawings, there is illustrated in FIG. 1 and FIG. 2, a preferred specific embodiment of the test chip of the invention. The test chip 20 has an insulating substrate 22 preferably formed of a monocrystalline silicon substrate 24 with an overlying layer 26 of Silicon Dioxide $SiO_2$. Layer 26 preferably has a thickness in the range of 10K to 12K Angstroms, and is formed by exposing the substrate 24 to an oxidizing environment at elevated an temperature. Alternatively, the substrate 24 can be formed of polycrystalline silicon or comparable materials, and the layer 26 can be of other materials such as $SiO_2$ formed by chemical vapor deposition techniques, Silicon Nitride materials, glass, or organic materials. Still further insulating substrate 22 can be formed of a solid substrate of an insulating material such as quartz, organic polymer material etc. A metal layer 28 is deposited on the surface of substrate 22. Preferably the layer 28 is formed Al, but any metal layer can be used, depending on the type of test desired. The thickness of the metal layer 28 is typically in the range of 6K to 12K Angstroms. A passivating layer 30 is then deposited over the surface of substrate 22, including metal layer 28, and opening 32 formed therein. Openings 32 can be formed by conventional photolithographic and etching techniques, which are well known. The openings 32 typically have an area of $75 \times 75$ um² to $120 \times 120$ um². An elongated master ground terminal opening 34 is also formed in layer 30. Opening 34 has a significantly greater area than each of openings 32. Gold terminals 36 are then formed in openings 32, and master terminal 38 is formed in opening 34. Terminals 36 are Aluminum or Gold wire bond pads or any other suitable interconnection structure. Terminal 38 is a large pad, which has an area of $750 \times 75$ um² to $1200 \times 120$ um². Using this larger pad for 12 bonding connection sites, to reduce the terminal bonding resistance, and reduce the bonding resistance sensitivity. Terminals 36 and 38 are bonded to metal layer 28, and are arranged for the bonding stress and resistance sensitivity test. Terminals 36 are the test pins and terminal 38 is the terminal stop for each test pin, because terminal 38 has very low bonding resistance and no sensitivity change to the bonding resistance change. The bonding resistance at terminal 38 is reduced by the parallel connection.

Figure 3:
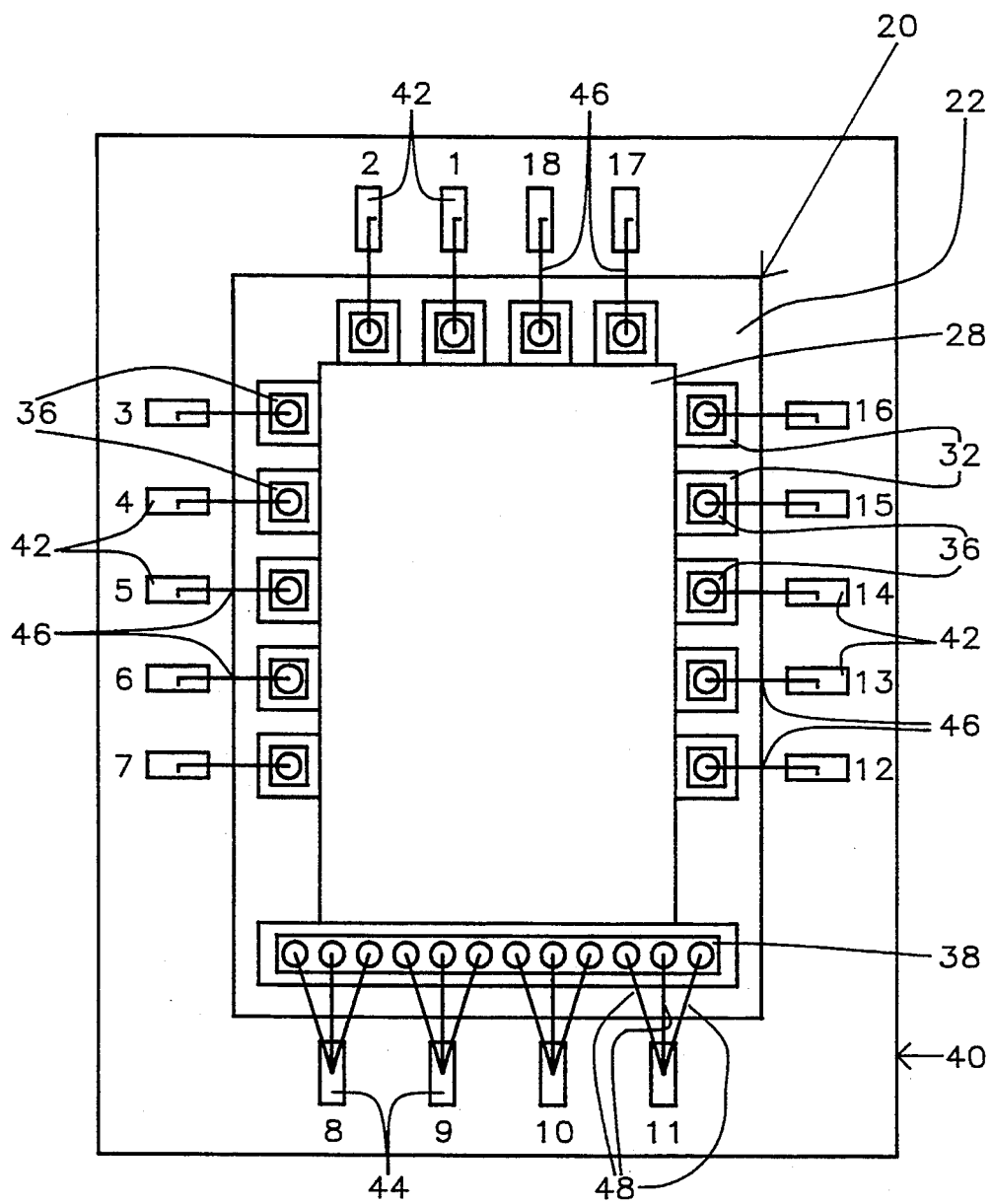
FIG. 3 is a top plan view of the test chip of the invention shown operatively connected to I/O test terminals of a package chip.
Figure 4:
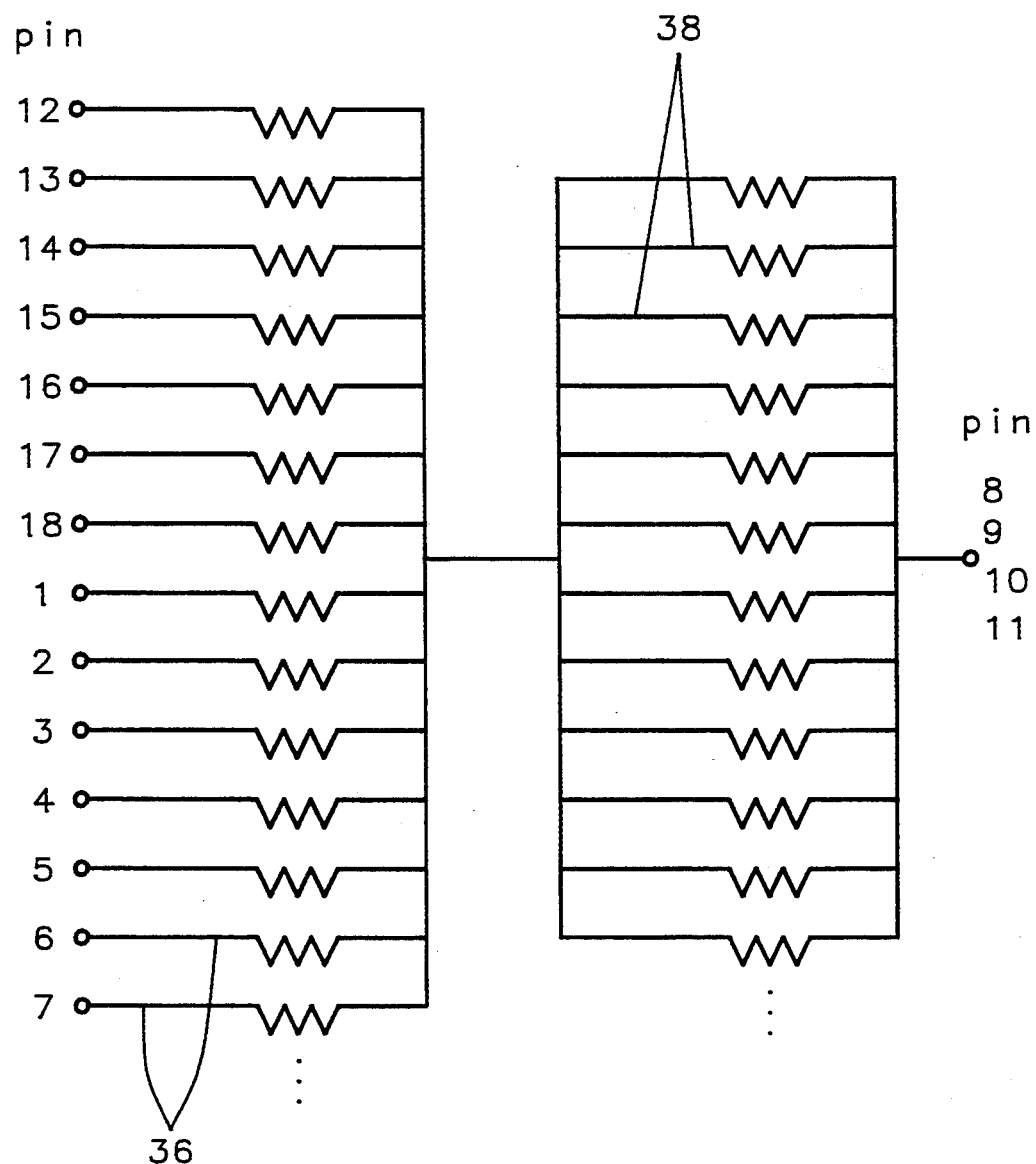
FIG. 4 is a simple equivalent circuit of this test chip at the bonding resistance, its schematic diagram illustrating the electrical arrangement of the I/O terminals and test pads.

As shown in FIG. 3, test chip 20 is shown mounted on a package substrate 40, formed of any suitable insulating material. Substrate 40 is shown with I/O terminal 42, which can be of any type known to the prior art, such as pads which protrude outside of an enclosure cap (not shown), pins which extend through the substrate, etc. I/O terminals 44 are shown, provided for connection to the master terminal 38. The various terminals are shown numbered from 1 to 18, although any suitable number can be provided. The terminals 36 are shown electrically connected to I/O terminals 42 by Au wires 46, and terminals 38 connected to I/O terminal 44 by Au wires 48. The wires 46 and 48 are bonded to the respective terminals and I/O terminals by thermo-compression bonding, which is well known. As shown in FIG. 3, the master terminal 38 has a significantly larger area than the terminal 36. Also terminal 38 is connected to multiple I/O terminals 44 using multiple wires 48. The master terminal is designed so that it will not be materially affected by conditions within the package, which will affect the integrity of terminals 36, which are similar to terminals used to join actual integrated circuit devices. The electrical arrangement is shown in FIG. 4. The master terminal consists of a number of parallel connections in turn, connected in parallel to a number of I/O terminals.

The method involves monitoring the individual resistances of the Au terminals 36, shown connected to I/O terminals 1 through 7 and 12 through 18. The master terminal 38 serves as a common connection to all the terminals 36. Typically the package containing the Au terminals 36 is subjected to stress over a period of time and the electrical resistances of the terminals 36 are measured. The type of stress can vary, including maintaining the package at elevated temperatures that are will above the normal operating temperatures of semiconductor devices, maintaining the package at prolonged low temperatures that are below the normal operating temperatures of devices, thermal cycling, vibration of the package, thermal and mechanical shock, etc. The resistances of the terminals 36 are measured over time to evaluate their resistance to the condition under consideration. The test device can also be used to evaluate the terminals performance under various environments that include humidity, corrosive gases, etc. The test chip can be used in a separate package in an application employing semiconductor devices, such as large computers, etc. to serve as a monitor during normal operation of the application. Alternately it could be housed in the same package containing operating semiconductor devices to serve as an ongoing monitor of the integrity of the terminals.

A typical test for the test chip in a package of the inventions is to evaluate the effects of temperature and humidity on terminal integrity. Phosphorus is a part of many surface oxide layers used in devices. Sufficient phosphorus combined with humidity will form phosphoric acid, which will corrode Al metallization. A typical test run will maintain a predetermined temperature of 85° C. and a relative humidity of 85% for a time of 1000 hours. The resistances of the terminals are monitored to provide an indication of the deterioration which occurs. Other environments such as Chlorine, which forms Hydrogen chloride can be integrated. Temperatures in the operating environment of semiconductor devises can cause contact terminal degradation, inter-metallic material formation between a Gold and Aluminum bond, aging of plastic material, oxidation, etc. These effects can be evaluated by accelerated test, i.e. elevated operating temperatures, with the test chip that embodies the features under study.

Extreme temperature excursions put mechanical stress on structures embodying materials with different coefficients of thermal expansions. In integrated circuit devices, these materials can include silicon, oxide, Aluminum, plastic, bond wires, supporting substrate materials, etc. A thermal shock test procedure might include subjecting the test device to alternating ambient temperatures of −65° C. to +150° C. with a cycle time of 30 minutes. Temperature humidity, pressure cooker and salt atmosphere produce corrosion stress for bonding interface of the pad metal and consequently changes the bonding resistance. High temperature storage, low temperature storage, temperature cycling and thermal shock are all thermal expansion stresses, for intermetallic formation between Gold and Aluminum. The bonding resistance is changed by temperature sensitivity. Vibration, mechanical shock and mechanical stress on Gold and Aluminum interface bring about the resistance changes. Use of this test chip for reliability experiments can provide data on material stress vs bonding resistance sensitivity, and allow optimization of device design.

While the invention has been particularly shown and described with reference to the preferred embodiments thereof, it will be understood by those skilled in the art that various changes in form and detail may be made therein without departing from the spirit and scope of the invention.

What is claimed is:

1. A method of testing the reliability of Gold (Au) terminals in a sealed semiconductor package comprising:

placing a test chip in a semiconductor substrate, a conductive metal layer on the insulating substrate, a passivating layer over the metal layer provided with a plurality of openings, a plurality of Au terminals in said opening bonded to said metal layer, and a master ground terminal bonded to the metal layer that has a larger area in contact with said metal layer than any of the Au terminals and is designed to maintain a more stable electrical resistance;

providing Input/Output terminals in said package for each of said plurality of Au terminals and said master ground terminal;

joining said Au terminals and said master ground terminal to said I/O terminals with Au wires;

sealing said test chips within the package;

subjecting the test chip to adverse conditions that can alter the integrity of the bond between the Au terminals and the metal layer; and monitoring the resistance of each of said Au terminals to determine any change of electrical resistance of the Au terminal with the passage of time.

2. The method of claim 1, wherein said ground terminal is comprised of an elongated opening in said passivating layer, a plurality of Au terminals in said elongated opening bonded to said metal layer, a plurality of Au wires connecting said Au terminals in said elongated opening to a common I/O terminal.

3. The method of claim 1, wherein the electrical resistance of each of said plurality of Au terminals is measured individually over a period of time.

4. The method of claim 1, wherein the package is exposed to prolonged high temperatures that are well above the normal operating temperatures of semiconductor devices, as the resistances of the Au terminals are monitored, to provide data on accelerated aging.

5. The method of claim 1, wherein the package is exposed to prolonged low temperatures that are well below the normal operating temperature of semiconductor devices as the resistances of the Au terminals are monitored.

6. The method of claim 1, wherein the package is exposed to thermal cycling wherein the package temperature is varied periodically from temperatures well above and well below the normal operating temperatures of semiconductor devices, as the resistances of the Au terminals are monitored.

7. The method of claim 1, wherein the package is exposed to vibration over a period of time as the resistances of the Au terminals are monitored.

8. A test chip for determining the change of integrity of Au terminal with the passage of time in a sealed semiconductor package comprising:

an insulating substrate;

a metal layer over said insulating substrate;

a passivating layer over said metal layer;

a plurality of spaced openings in said passivating layer located over said metal layer;

a plurality of Au bumps in said plurality of openings, each of said bumps being bonded to said metal layer forming an electrical terminal to said metal layer;

at least one master ground terminal to said metal layer comprised of at least one opening in said passivating layer, at least one Au bump in said opening, said master ground terminal having a larger area in contact with said metal layer than any of the Au electrical terminals, and is designed to maintain a more stable resistance; and said electrical terminals and said ground terminal adapted to be bonded to Au wires.

9. The test chip of claim 8, wherein said metal layer is a layer of Aluminum (Al).

10. The test chip of claim 8, wherein said insulating substrate is comprised of a silicon substrate with an overlying electrically insulating layer.

11. The test chip of claim 10, wherein said electrically insulating layer on said silicon substrate is a layer of Silicon Dioxide ($SiO_2$).

12. The test chip of claim 11, wherein said metal layer is Al.

13. The test chip of claim 9, wherein said passivating layer is formed of nitride, phospho-silicate glass, and polyimide.

14. The test chip of claim 8, wherein said master terminal is comprised of an elongated opening in said passivating layer, and a plurality of spaced Au bumps in said elongated opening.

15. The test chip of claim 8 in combination with a sealed semiconductor package.

16. The test chip and semiconductor package combination of claim 15, wherein said package includes a base with I/O terminals, Au wires joining said electrical terminals and said master ground terminals on said test chip to said I/O terminals, and a cover enclosing said test terminal and Au wires.

17. The test chip and semiconductor package combination of claim 16, wherein said package also includes functional semiconductor devices electrically connected to additional I/O terminal in said base.

* * * * *